United States Patent [19]

Gatherer

[11] Patent Number: 5,802,461
[45] Date of Patent: Sep. 1, 1998

[54] APPARATUS AND METHOD FOR TIMING RECOVERY IN VESTIGIAL SIBEBAND MODULATION

[75] Inventor: Alan Gatherer, Richardson, Tex.

[73] Assignee: Texas Instruments Incorporated, Dallas, Tex.

[21] Appl. No.: 714,645

[22] Filed: Sep. 16, 1996

[51] Int. Cl.$^6$ .................. H03C 1/60; H04B 1/68; H04H 1/00

[52] U.S. Cl. .................. 455/204; 375/270; 375/301; 375/321; 375/373; 455/47

[58] Field of Search ............... 455/47, 204; 375/270, 375/301, 321, 373

[56] References Cited

U.S. PATENT DOCUMENTS

| | | | |
|---|---|---|---|
| 3,605,017 | 9/1971 | Chertok | 455/47 |
| 3,619,785 | 11/1971 | Farrow | 375/373 |
| 5,668,831 | 9/1997 | Claydon | 375/232 |
| 5,673,293 | 9/1997 | Scarpa | 455/204 |

*Primary Examiner*—Howard Britton
*Attorney, Agent, or Firm*—Warren L. Franz; Wade James Brady, III; Richard L. Donaldson

[57] ABSTRACT

Apparatus and method (10) for recovering timing information from a vestigial sideband (VSB) modulated signal generate a left hand component signal and a right hand component signal from the received signal, and filters $B_l(f)$ and $B_r(f)$ (12, 14) filter the left hand and right hand component signals respectively. The filtered signals are then multiplied together without taking the complex conjugate of either signal, as in band edge component maximization (BECM). The generated output signal may be used in a feedback loop to regulate the sample rate of an analog to digital converter (32).

22 Claims, 3 Drawing Sheets

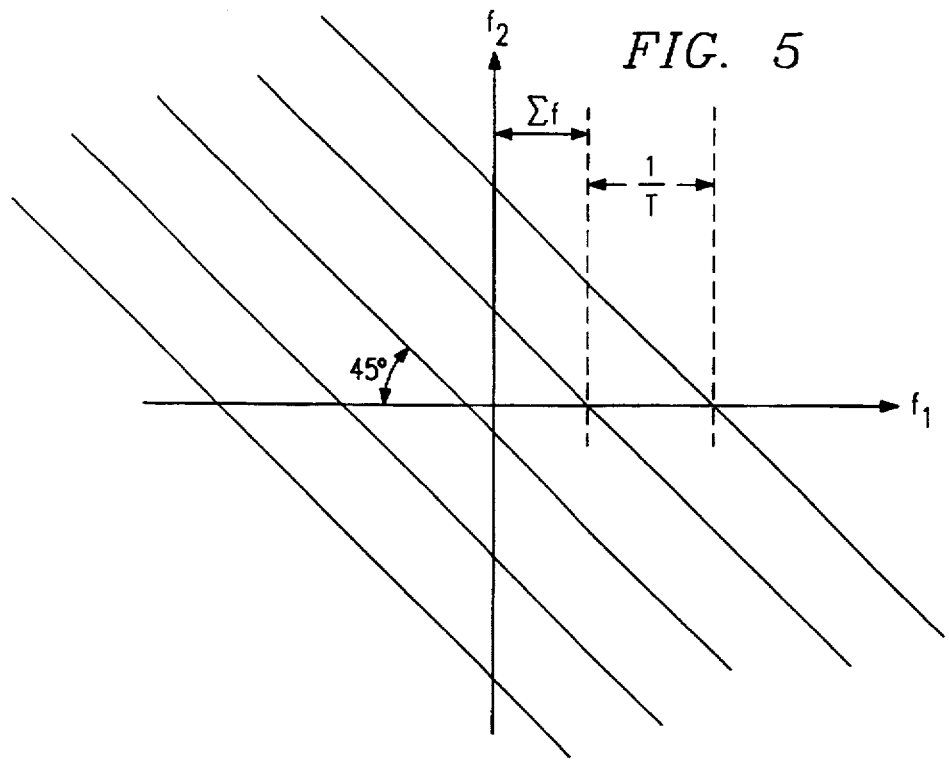
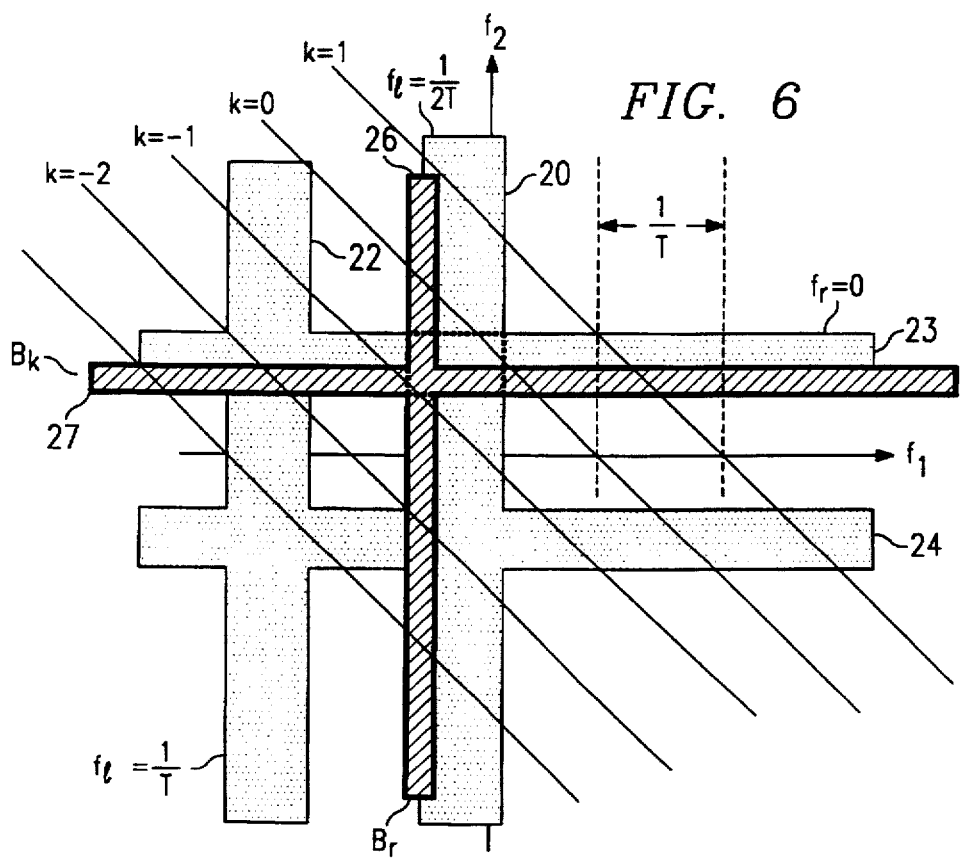

5,802,461

APPARATUS AND METHOD FOR TIMING RECOVERY IN VESTIGIAL SIBEBAND MODULATION

TECHNICAL FIELD OF THE INVENTION

This invention is related in general to the field of digital communications. More particularly, the invention is related to apparatus for timing recovery in vestigial sideband modulation and a method for performing the same.

BACKGROUND OF THE INVENTION

Vestigial Sideband Modulation (VSB) was recently chosen by the Grand Alliance over quadrature amplitude modulation (QAM) as the modulation standard for terrestrial broadcast of HDTV (high definition television). Vestigial sideband modulation is also important in the digital cable transmission arena.

Presently the only vestigial sideband modulation system being used in digital video transmission tests was designed by Zenith. The Zenith design has a significant amount of analog processing, in which the receiver converts the received signals to digital signals by sampling the received signal at the symbol rate just before the equalizer. In the Zenith system, timing recovery is implemented using low frequency training pulses in the data. If the pulse frequency is high, a large portion of symbols are used for timing instead of transmitting data, resulting in bandwidth inefficiency. If the pulse frequency is low, the timing recovery circuit receives information at a very low rate and thus converges very slowly.

Ideally the receiver analog to digital converter (ADC) samples at the identical phase and frequency as the digital to analog converter (DAC) of the transmitter. Because the transmitter and receiver clocks are physically separate and only nominally of the same frequency, the ADC samples the data a slightly different frequency and unknown phase. Timing recovery is thus needed to correct the frequency and phase errors in the receiver clock. Timing recovery algorithms typically generate outputs that are proportional to the phase and/or frequency error which are then used by a feedback system to adjust the ADC sampling rate directly or resample the output of the ADC. As the market for vestigial sideband modulation receivers grows and the price drops, we will see an increase in the amount of digital processing in vestigial sideband modulation receivers. Accordingly, there is a need to develop a digital timing recovery scheme for vestigial sideband modulation. One of the most popular digital timing recovery schemes in quadrature amplitude modulation systems is band edge component maximization (BECM), which was originally proposed by Godard in "Passband Timing Recovery in an All-Digital Modem Receiver", *IEEE Transactions on Communications*, Vol. COM-26, No. 5, May 1978. Band edge component maximization is a method for extracting timing phase information directly from the passband signal without having to demodulate and decode the signal. It is a blind timing recovery technique that does not require training pulses and receives the output of the ADC as its input without a feedback loop. However, band edge component maximization does not work when applied directly to vestigial sideband modulation.

SUMMARY OF THE INVENTION

Accordingly, there is a need for apparatus and method for timing recovery in vestigial sideband modulation in order to implement an all digital receiver.

In accordance with the present invention, apparatus and method for timing recovery are provided which eliminates or substantially reduces the disadvantages associated with prior circuits and methods.

In one aspect of the invention, the apparatus generates a left hand component signal and a right hand component signal from the received vestigial sideband (VSB) modulated signal, and filters $B_l(f)$ and $B_r(f)$ filter the left hand and right hand component signals respectively. The filtered signals are then multiplied together without taking the complex conjugate of either signal, as in band edge component maximization (BECM).

In another aspect of the invention, the generated output signal may be used in a feedback loop to regulate the sample rate of an analog to digital converter or the resampling position of an interpolator whose input is the ADC output.

In yet another aspect of the invention, a method for recovering timing information from a vestigial sideband (VSB) modulated signal received by a receiver generates a left hand component signal from said VSB signal and multiplies the VSB signal with $e^{j2\pi f_c t}$ to generate a right hand component signal. The left and right hand component signals are both low pass filtered, and the filtered signals are multiplied together without first taking a complex conjugate of either signal. The resultant signal is then used to control the rate at which the VSB signal is sampled.

BRIEF DESCRIPTION OF THE DRAWINGS

For a better understanding of the present invention, reference may be made to the accompanying drawings, in which:

FIG. 5 is a plot showing the position of delta function edges in the frequency plane;

FIG. 6 is a plot showing the line integral positions for $s=-1$ in the frequency plane;

DETAILED DESCRIPTION OF THE INVENTION

Figure 1:
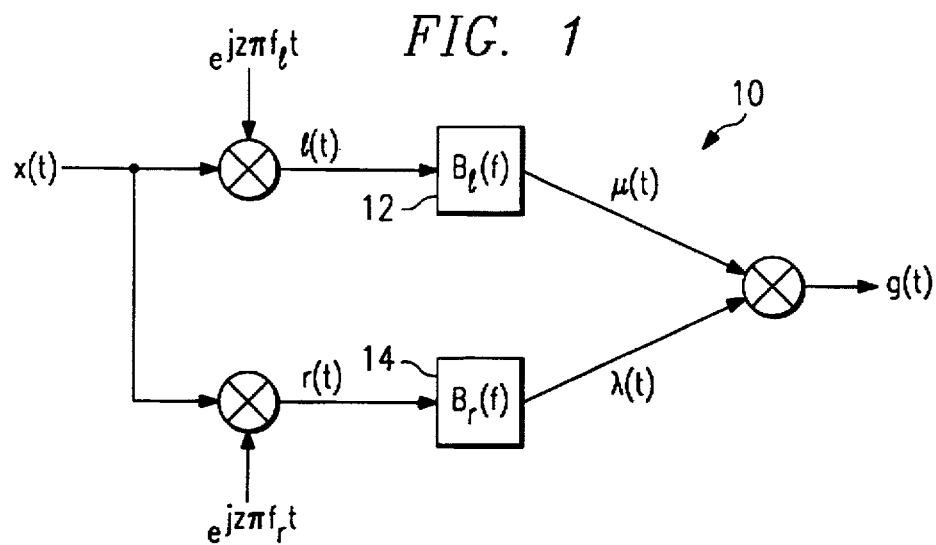
FIG. 1 is a block diagram of an embodiment of the timing recovery circuit and algorithm constructed in accordance to the teachings of the present invention.

The preferred embodiment(s) of the present invention is (are) illustrated in FIGS. 1–4, like reference numerals being used to refer to like and corresponding parts of the various drawings.

Figure 2:
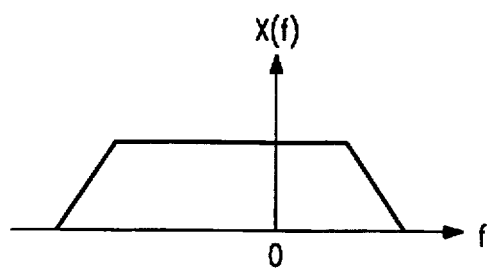
FIG. 2 is a graphical representation of a complex baseband signal.

Referring to FIG. 1, the received signal, $x(t)$, is provided as the input to a timing recovery algorithm and circuit 10 constructed according to the teachings of the present invention. The baseband signal, $x(t)$, is of the form:

$$x(t) = \Sigma a_n h(t - nT - \tau_o), \tag{1}$$

where $a_n$, is the $n^{th}$ input data symbol, T is the symbol period, h(t) is the complex pulse shape whose spectrum is the demodulated spectrum of the positive frequency part of the transmitter output signal, and $\tau_e$ is the timing phase error to be estimated. The complex baseband spectrum is shown in FIG. 2. Note that the baseband signal is not necessarily centered around the zero frequency axis as in Quadrature amplitude modulation, or positioned only on one side of the zero frequency axis as in VSB. The derivation that follows will apply to the more general case of any h(t).

Figure 3:
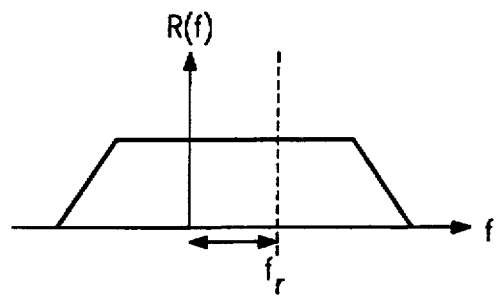
FIG. 3 is a graphical representation of a right shifted complex baseband signal.
Figure 4:
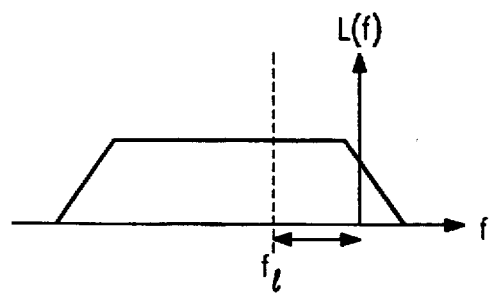
FIG. 4 is a graphical representation of a left shifted complex baseband signal.

The band edge components are produced by shifting the spectrum of the signal right and left so that each edge of the spectrum is at the origin, and then low pass filtering. As a generalization, assume that any shift to the right, $f_r$, and shift to the left $f_l$, is allowed as shown in FIGS. 3 and 4, respectively, to produce the right hand component, r(t), and the left hand component, l(t), respectively. The effect of the frequency shift to the right produces:

$$r(t) = \sum_n a_n h(t - nT - \tau_e) e^{j2\pi f_r t} \quad (2)$$

$$= \sum_n a_n e^{j2\pi f_r (nT+\tau_e)} h(t - nT - \tau_e) e^{j2\pi f_r (t-nT-\tau_e)}$$

$$= \sum_n a_n^{(r)} h_r(t - nT - \tau_e),$$

where $a_n^{(r)} = a_n e^{j2\pi f_r (nT+\tau_e)}$ and is a rotated data vector, and $h_r(t) = h(t) e^{j2\pi f_r t}$ is the modulated pulse shape. Similarly the left hand component is:

$$l(t) = \sum_n a_n^{(l)} h_l(t - nT - \tau_e), \quad (3)$$

where $a_n^{(l)} = a_n e^{j2\pi f_l t}$ and is a rotated data vector, and $h_l(t) = h(t) e^{j2\pi f_l t}$ is the modulated pulse shape.

The right hand component and left hand component are each provided as input to two filters, $B_r(f)$ and $B_l(f)$, to produce $\lambda(t)$ and $\mu(t)$, respectively. Preferably, filters $B_r(f)$ and $B_l(f)$ are low pass filters with a very narrow bandwidth. The filtered signals are:

$$\lambda(t) = \sum_n a_n^{(r)} \int H(f_1 - f_r) B_r(f_1) e^{j2\pi f_1 (t-nT-\tau_e)} df_1 \quad (4)$$

$$\mu(t) = \sum_m a_m^{(l)} \int H(f_2 - f_l) B_l(f_2) e^{j2\pi f_2 (t-mT-\tau_e)} df_2. \quad (5)$$

The output is then:

$$g(t) = \lambda(t) \mu(t) \quad (6)$$

as shown in FIG. 1. Note that for band edge component maximization, $g(t) = \lambda(t)^* \lambda(t)$, where the complex conjugate of $\lambda(t)$ is taken before the terms are multiplied together.

If the data is independent and identically distributed and zero mean then $$E[a_n^{(r)} a_m^{(l)}] = \delta(n+m) \xi_a e^{j2\pi (f_l - f_r) nT} e^{j2\pi (f_l - f_r) \tau_e} \quad (7)$$

where $\xi_n = E[|a_n|^2]$ is the symbol power. The expectation of the output then is:

$$E[g(t)] = \quad (8)$$

$$e^{j2\pi \Sigma f \tau_e} \xi_a \iint H(f_1 - f_r) H(f_2 - f_l) B_r(f_1) B_l(f_2) e^{j2\pi (f_2+f_1) t} e^{-j2\pi (f_1+f_2) \tau_e}$$

$$\sum_n (e^{-j2\pi((f_2-f_l)-(f_l-f_r))nT}) df_1 df_2$$

and converting from a sum of exponentials to a sum of deltas:

$$E[g(t)] = \quad (9)$$

$$e^{j2\pi \Sigma f \tau_e} \xi_a \iint H(f_1 - f_r) H(f_2 - f_l) B_r(f_1) B_l(f_2) e^{j2\pi (f_2+f_1) t} e^{-j2\pi (f_1+f_2) \tau_e}$$

$$\frac{1}{T} \sum_k \delta\left( (f_2 + f_1) - \Sigma f - \frac{k}{T} \right) df_1 df_2$$

where $\Sigma f = f_l + f_r$ is the sum of the frequency offsets of the right and left hand components. The two dimensional integral converted to a sum of one dimensional line integrals is shown in FIG. 5, which shows the position of delta function edges in the frequency plane. Hence $$E[g(t)] = \quad (10)$$

$$\frac{\xi_a}{T} \sum_k \left( \int H(f-f_r) H\left( -f+f_r+\frac{k}{T} \right) B_r(f) B_l\left( -f + \Sigma f + \frac{k}{T} \right) df \right.$$

$$\left. e^{j2\pi(\Sigma f + \frac{k}{T}) t} e^{-j2\pi \frac{k}{T} \tau_e} \right)$$

A solution exists for vestigial sideband modulation, which has a pulse shape of spectral width slightly over ½T. Set $f_r = 0$, so that $H(f-f_r) = H(f)$ has one edge at the origin and has edges at zero and s/2T, where s is either +1 or −1 depending on which edge is at the origin. For k=s, the second term in the integral in Equation (10) is H[−[f−s/T]] which has edges at s/2T and s/T. Therefore the first two terms in the integral do overlap at one edge with phase information. To remove the dependency of the expectation in Equation (10) on time, set $$f_l = -\frac{s}{T} \quad (11)$$

so that $\Sigma f + k/T = 0$ for k=s. The filters, $B_r(f)$ and $B_l(f)$, are chosen so that only the line integral at k=s is significant.

As an example for determining $B_r(f)$ and $B_l(f)$, consider setting s=−1. The delta function edge positions are as shown in FIG. 6. The dotted regions 20–24 represent the positions of the energy in the two axes. Only where the horizontal and vertical hatched regions overlap will integration produce a non-zero result. The vertical hatched region 26 represents the band pass region for $B_r(f)$ over $f_1$, that is required if the region of interest around −1/2T is to be retained. The position of the filter $B_l(f)$ over $f_2$ is represented by the horizontal shaded region 27.

For k=−1, the two shaded regions 26 and 27 and the two hatched regions 20 and 23 coincide with the delta function edge and produce a non-zero result. Because no other delta function edge passes through the intersection of all four regions 20, 23, 26, and 27, it can be shown that the chosen filter pair also rejects all the terms associated with the other k values. Note however that if $B_l(f)$ was forced to be a real filter, so that the horizontal shaded region 27 was reflected in the origin, then the delta function edge associated with k=−2 would pass through the intersection of all four regions. The k=−2 term would thus be significant in the summation. However, if $B_l(f)$ is forced to be real, then no other intersection of a delta function edge and all four regions exists, so that no extra unwanted terms are added to the summation.

Therefore, for the chosen filters as shown in FIG. 7 and s=−1 the final result is:

$$E[g(t)] = e^{j2\pi \frac{\tau_e}{T}} \left[ \frac{\xi_a}{T} \int H(f) H\left( -\left( f + \frac{1}{T} \right) \right) B_r(f) B_l(-f) df \right] \quad (12)$$

The desired result is a modified band edge component maximization (MBECM) function whose expectation is phase dependent on the timing phase error.

Figure 7A:
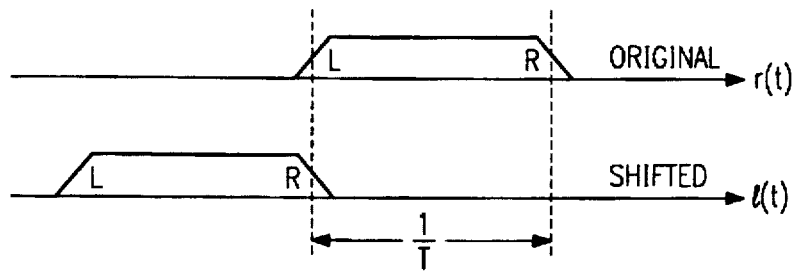
FIG. 7A is a graphical representation of band edge component maximization.
Figure 7B:
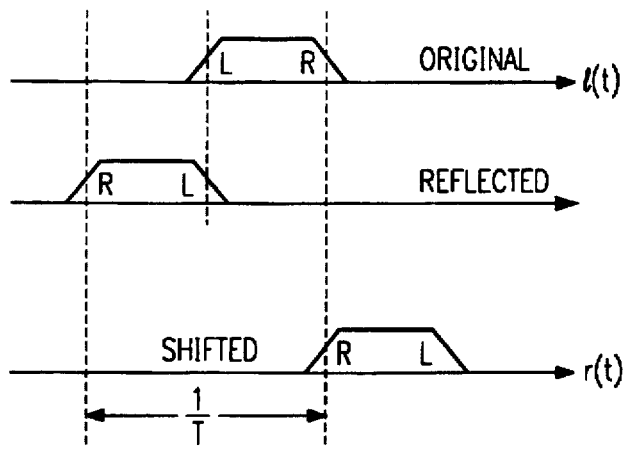
FIG. 7B is a graphical representation of the timing recovery method according to the present invention.

The difference between band edge component maximization and modified band edge component maximization is highlighted graphically in FIGS. 7A and 7B. In band edge component maximization, the image is formed by shifting the original spectrum by k/T, as shown in FIG. 7A. In order for the image to overlap the original, the width of the original must be at least 1/T, which is true for quadrature amplitude modulation but not for vestigial sideband modulation. Hence, band edge component maximization does not work for vestigial sideband modulation.

However as shown in FIG. 7B, in modified band edge component maximization the image is formed by reflecting the original spectrum about one edge of the spectrum before shifting it by k/T. A shift of 1/T then results in the image overlapping the original for vestigial sideband modulation, because there is an edge of the original and an edge of the image which are separated by twice the length of the image.

Figure 8:
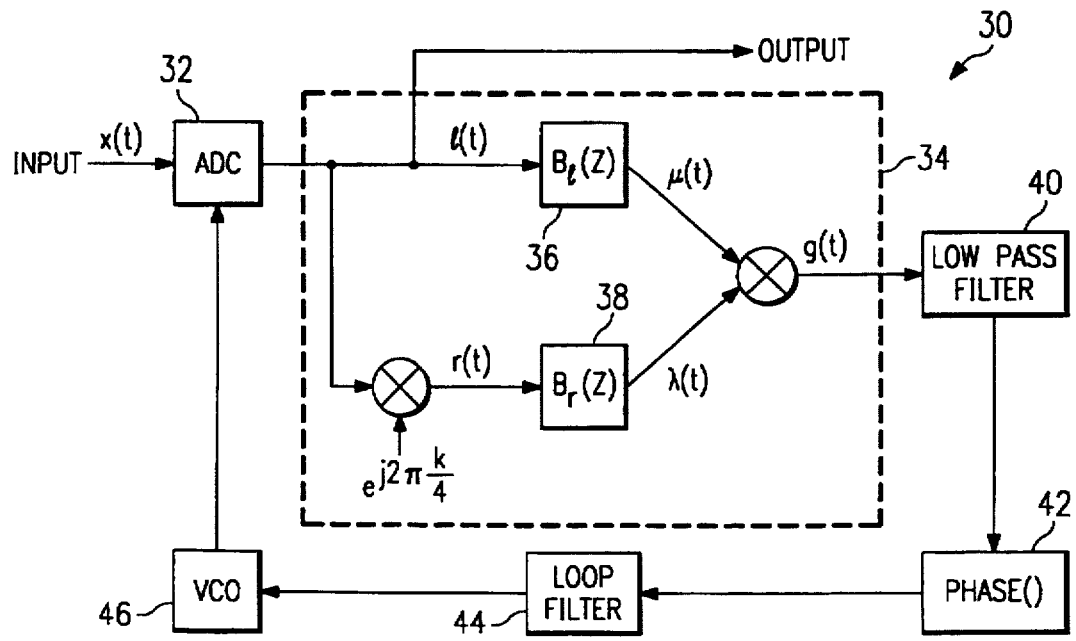
FIG. 8 is a block diagram of an embodiment of the timing recovery circuit and algorithm using a first order feedback loop constructed in accordance to the teachings of the present invention.

Referring to FIG. 8, a timing recovery circuit 30 constructed according to the teachings of the present invention is shown. The heavy lines are used to denote complex signals. The analog baseband signal received from the channel, x(t), is provided as an input to an analog to digital converter (ADC) 32, which converts x(t) to a digital signal. Setting $f_r=0$, and $f_l=1T$, the resultant modulated left hand and right hand component signals, l(t) and r(t), are then filtered with low pass filters $B_r(f)$ and $B_l(f)$, respectively. To keep the design of timing recovery circuit 30 simple, single pole IIR (infinite impulse response) filters 36 and 38 are used so that for the 4/T sampling rate at analog to digital converter 32:

$$B_r(z) = \frac{1}{1+0.95e^{j3\pi/4}z^{-1}} \quad (13)$$

and $$B_l(z) = \frac{1}{1+0.95e^{-j3\pi/4}z^{-1}} \quad (14)$$

were chosen. Recall that $B_r(Z)$ may also be real:

$$B_r(z) = \frac{1}{1+2(0.95)\cos(3\pi/4)z^{-1}+(0.95)^2z^{-2}} \quad (15)$$

The filtered signals, μ(t) and λ(t), are multiplied to produce g(t).

In the vestigial sideband modulation design proposed by Zenith for HDTV, the equalizer samples at the symbol rate. The output, g(t), is provided to a low pass filter 40 to eliminate noise. Low pass filter may be a single pole filter with pole at 0.9999 to get a running average of the modified band edge component maximization output. The average from filter 40 is then rotated to remove the phase bias in the result and provided to a phase detector circuit 42. The output from phase detector 42 is then provided to a loop filter 44 with a zero order or constant scaling. The output from loop filter 44 is used as a control input to a voltage controlled oscillator (VCO), which changes the sampling frequency of analog to digital controller 32. When analog to digital controller 32 is sampling at the correct frequency and phase l(t) becomes the demodulation output.

Other more complex algorithms have been proposed to close the loop in band edge component maximization for quadrature amplitude modulation, for example N. K. Jablon, "Timing Recovery for Blind Equalization," 22nd *Asilomar Conf. Signals, Syst, Comput. Rec.*, Pacific Grove, Calif. October 1988; and N. K. Jablon, "Joint Blind Equalization, Carrier Recovery, and Timing Recovery for High-Order QAM Signal Constellations," *IEEE Transactions on Signal Processing*, VOL. 40, No. 6, June 1992. These algorithms may be used to improve the performance of modified band edge component maximization for vestigial sideband modulation since the modified band edge component maximization output contains essentially the same information as the band edge component maximization output.

The present invention is also described in "Band Edge Component Maximization for Timing Recovery in Vestigial Sideband Modulation" by Alan Gatherer and submitted to the International Conference on Communications, on Sept. 11, 1995, herein incorporated by reference.

Although the present invention and its advantages have been described in detail, it should be understood that various changes, substitutions and alterations can be made therein without departing from the spirit and scope of the invention as defined by the appended claims.

What is claimed is:

1. Apparatus for timing recovery in a receiver receiving a vestigial sideband modulated (VSB) signal, comprising:

first means for frequency shifting said received signal a first predetermined amount in a first direction for producing a first frequency shifted signal;

second means for frequency shifting said received signal a second predetermined amount in a first direction for producing a second frequency shifted signal;

a first filter coupled to said first frequency shifting means for filtering said first frequency shifted signal;

a second filter coupled to said second frequency shifting means for filtering said second frequency shifted signal; and means for multiplying said filtered signals without taking the complex conjugate of any one thereof and generating an output signal from which timing information may be extracted.

2. The apparatus, as set forth in claim 1, wherein said first filter is:

$$B_r(z) = \frac{1}{1+0.95e^{j3\pi/4}z^{-1}}$$

3. The apparatus, as set forth in claim 1, wherein said second filter is:

$$B_l(z) = \frac{1}{1+0.95e^{-j3\pi/4}z^{-1}}$$

4. The apparatus, as set forth in claim 1, wherein said first filter is:

$$B_r(z) = \frac{1}{1+2(0.95)\cos(3\pi/4)z^{-1}+(0.95)^2z^{-2}}$$

5. The apparatus, as set forth in claim 1, wherein said first frequency shifting means multiplies said received signal with $e^{j2\pi f_l t}$, where $f_l$ is the amount of frequency shift to the left.

6. The apparatus, as set forth in claim 1, wherein said second frequency shifting means multiplies said received signal with $e^{j2\pi f_r t}$, where $f_r$ is the amount of frequency shift to the right.

7. The apparatus, as set forth in claim 1, wherein said first frequency shifting means shifts said received signal by 1/T to the left, where T is a symbol period of symbols transmitted in said signal.

8. The apparatus, as set forth in claim 1, wherein said second frequency shifting means shifts said received signal by zero amount.

9. The apparatus, as set forth in claim 1, wherein said second frequency shifting means multiplies said received signal with $e^{j2\pi k/4}$.

10. The apparatus, as set forth in claim 1, further comprising a feedback loop receiving said output signal and generating a control signal controlling a sampling rate of said received signal.

11. The apparatus, as set forth in claim 1, further comprising:
- a third low pass filter receiving said output signal and generating a running average;
- a phase detector coupled to said third low pass filter and detecting a phase of said running average;
- a loop filter coupled to said phase detector and generating a filtered output;
- a voltage controlled oscillator coupled to said loop filter and generating a control signal in response to said filtered output; and
- an analog to digital converter coupled to said voltage controlled oscillator receiving said VSB signal, its sampling rate being controlled by said control signal.

12. A method for recovering timing information from a vestigial sideband modulated signal received at a receiver, comprising the steps of:
- generating a left hand component signal of said VSB signal by frequency shifting said VSB signal a predetermined amount to the left;
- generating a right hand component signal of said VSB signal by frequency shifting said VSB signal a predetermined amount to the right;
- filtering said left hand component signal and generating a filtered left hand component signal;
- filtering said right hand component signal and generating a filtered right hand component signal; and
- generating an output signal having timing information by multiplying said filtered left and right hand component signals without taking the complex conjugate of either signals.

13. The method, as set forth in claim 12, wherein said left hand component signal filtering step includes the step of using filter $$B_l(z) = \frac{1}{1 + 0.95 e^{-j3\pi/4} z^{-1}}$$

14. The method, as set forth in claim 12, wherein said right hand component signal filtering step includes the step of using filter $$B_r(z) = \frac{1}{1 + 0.95 e^{j3\pi/4} z^{-1}}$$

15. The method, as set forth in claim 12, wherein said right hand component signal filtering step includes the step of using filter $$B_r(z) = \frac{1}{1 + 2(0.95)\cos(3\pi/4) z^{-1} + (0.95)^2 z^{-2}} \qquad (16)$$

16. The method, as set forth in claim 12, further comprising the steps of generating a control signal from said output signal and controlling a sampling rate of said VSB signal.

17. The method, as set forth in claim 12, further comprising:
- low pass filtering said output signal and generating a running average;
- detecting a phase of said running average;
- loop filtering said running average and generating a filtered output;
- generating a control signal in response to said filtered output; and
- controlling a sampling rate of an analog to digital converter receiving said VSB signal.

18. The method, as set forth in claim 12, wherein said left hand component signal generating step includes the step of not frequency shifting said VSB signal.

19. The method, as set forth in claim 12, wherein said right had component signal generating step includes the step of frequency shifting said VSB signal 1/T to the right, where T is the symbol rate of symbols transmitted in said VSB signal.

20. A method for recovering timing information from a vestigial sideband (VSB) modulated signal received by a receiver, comprising the steps of:
- generating a left hand component signal from said VSB signal;
- multiplying said VSB signal with $e^{j2\pi ft}$ and generating a right hand component signal;
- filtering said left hand component signal;
- filtering said right hand component signal;
- multiplying said filtered left and right hand component signals without taking a complex conjugate of either signal and generating an output signal; and
- sampling said VSB signal at a sampling rate computed from said output signal.

21. The method, as set forth in claim 20, wherein said VSB signal multiplying step includes the step of multiplying said VSB signal with $e^{j2\pi k/4}$.

22. The method, as set forth in claim 20, wherein said low pass filtering steps includes the steps of low pass filtering with $$B_l(z) = \frac{1}{1 + 0.95 e^{-j3\pi/4} z^{-1}} \qquad (17)$$

$$B_r(z) = \frac{1}{1 + 0.95 e^{j3\pi/4} z^{-1}} \qquad (18)$$

and for low pass filtering said left and right hand component signals respectively.

* * * * *